United States Patent
Chang et al.

(10) Patent No.: US 10,312,863 B2
(45) Date of Patent: Jun. 4, 2019

(54) AMPLIFYING CIRCUIT AND ASSOCIATED RECEIVER

(71) Applicant: Realtek Semiconductor Corp., HsinChu (TW)

(72) Inventors: Chia-Jun Chang, Hsinchu (TW); Ka-Un Chan, Hsinchu County (TW)

(73) Assignee: Realtek Semiconductor Corp., HsinChu (TW)

( * ) Notice: Subject to any disclaimer, the term of this patent is extended or adjusted under 35 U.S.C. 154(b) by 0 days.

(21) Appl. No.: 16/151,353

(22) Filed: Oct. 4, 2018

(65) Prior Publication Data
US 2019/0131932 A1  May 2, 2019

(30) Foreign Application Priority Data
Oct. 31, 2017  (TW) .............................. 106137493 A

(51) Int. Cl.
*H04B 1/04* (2006.01)
*H03F 1/02* (2006.01)
*H03G 1/00* (2006.01)
*H02M 3/156* (2006.01)

(52) U.S. Cl.
CPC .......... *H03F 1/0205* (2013.01); *H02M 3/156* (2013.01); *H03G 1/0088* (2013.01); *H03F 2200/294* (2013.01); *H03F 2203/45526* (2013.01); *H03F 2203/7236* (2013.01)

(58) Field of Classification Search
CPC ......... H03F 2200/294; H03F 2200/451; H03F 3/211; H03F 3/72; H03F 1/223; H03F 1/56; H03F 2203/7236; H03F 3/189; H03F 3/193; H03F 3/195; H03F 3/2178; H03F 3/245; H03F 2200/129; H03F 2200/156; H03F 2200/372; H03F 3/68; H03F 1/0211; H03F 1/0261; H03F 1/0277
USPC ...................................... 455/127.2
See application file for complete search history.

(56) References Cited

U.S. PATENT DOCUMENTS

| | | | |
|---|---|---|---|
| 4,637,073 A * | 1/1987 | Selin ....................... | G01S 7/034 330/134 |
| 9,531,294 B2 | 12/2016 | Lawson | |
| 2007/0132511 A1* | 6/2007 | Ryynanen ........... | H03F 3/45085 330/254 |
| 2012/0223782 A1* | 9/2012 | Hirama ................ | H03B 5/1231 331/108 R |

* cited by examiner

*Primary Examiner* — Ajibola A Akinyemi
(74) *Attorney, Agent, or Firm* — Winston Hsu

(57) ABSTRACT

An amplifying circuit includes a first gain adjusting circuit, a second gain adjusting circuit, a load circuit and a switch module. When the amplifying circuit operates in a first mode, the first gain adjusting circuit receives a first input signal, and generates a first output signal to a second output terminal of the amplifying circuit via the load circuit and the switch module; and when the amplifying circuit operates in a second mode, the second gain adjusting circuit receives a second input signal, and generates a second output signal to a first output terminal of the amplifying circuit via the load circuit and the switch module.

10 Claims, 4 Drawing Sheets

US 10,312,863 B2

AMPLIFYING CIRCUIT AND ASSOCIATED RECEIVER

BACKGROUND OF THE INVENTION

1. Field of the Invention

The present invention relates to an amplifying circuit, and more particularly, to an amplifying circuit comprising a plurality of transmission paths with a shared loading.

2. Description of the Prior Art

In a conventional amplifying circuit comprising a plurality of transmission paths, gain adjusting circuits (e.g. an amplifier) on the transmission paths might output signals with different polarities, i.e. apart of the gain adjusting circuits outputs signals whose polarity is same as the input, and the other part of the gain adjusting circuits outputs signals whose polarity is different from the input. This difference in polarity of the input and output might occur when the path is switched which causes a heavy burden for the following circuits.

On the other hand, when the abovementioned transmission paths share a loading, these paths connect to the same terminal of the loading which limits the layout of the circuits.

SUMMARY OF THE INVENTION

One of the objectives of the present invention is therefore to provide an amplifying circuit comprising a plurality of transmission paths with a shared path to make sure the polarity of the output signals stays the same when the path is switched, and make the layout for other circuits flexible, to solve the aforementioned problems.

According to an embodiment of the present invention, an amplifying circuit is disclosed, wherein the amplifying circuit comprises: a first output terminal and a second output terminal; a first gain adjusting circuit; a second gain adjusting circuit; a loading circuit; and a switching circuit coupled to the first gain adjusting circuit, the second gain adjusting circuit, the loading circuit, the first output terminal and the second output terminal of the amplifying circuit. When the amplifying circuit operates in a first operating mode, the first gain adjusting circuit receives a first input signal, and transmits a first output signal to the second output terminal of the amplifying circuit via the switching circuit and the loading circuit, wherein the first output signal is not transmitted to the first output terminal at this point. When the amplifying circuit operates in a second operating mode, the second gain adjusting circuit receives a second input signal, and transmits a second output signal to the first output terminal via the switching circuit and the loading circuit, wherein the second output signal is not transmitted to the second output terminal at this point.

According to an embodiment of the present invention, a receiver is disclosed, comprising: a matching circuit; a low noise amplifier; and a transformer. The low noise amplifier comprises: a first output terminal and a second output terminal; a first gain adjusting circuit; a second gain adjusting circuit; a loading circuit; and a switching circuit coupled to the first gain adjusting circuit, the second gain adjusting circuit, the loading circuit, the first output terminal and the second output terminal of the amplifying circuit. When the low noise amplifier operates in a first operating mode, the first gain adjusting circuit receives a first input signal from an antenna via the matching circuit, and transmits a first output signal to the second output terminal of the low noise amplifier via the switching circuit and the loading circuit, wherein the first output signal is not transmitted to the first output terminal. When the low noise amplifier operates in a second operating mode, the second gain adjusting circuit receives a second input signal from the antenna via the matching circuit, and transmits a second output signal to the first output terminal of the low noise amplifier via the switching circuit and the loading circuit, wherein the second output signal is not transmitted to the second output terminal. In addition, one of two terminals of a side coil of the transformer connects to the first output terminal of the low noise amplifier, and the other connects to the second output terminal of the low noise amplifier.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
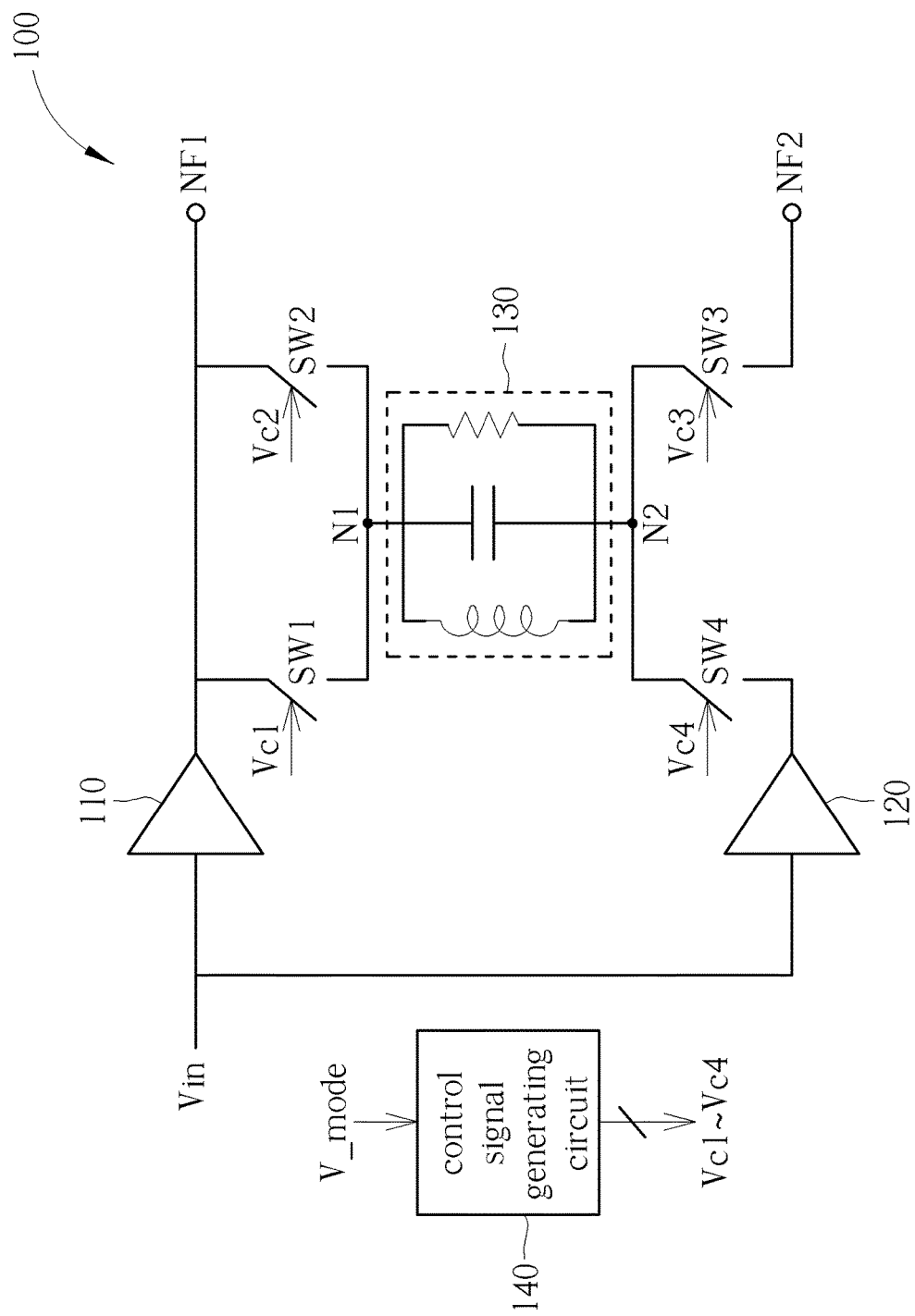
FIG. 1 is a diagram illustrating an amplifying circuit according to an embodiment of the present invention.

FIG. 1 is a diagram illustrating an amplifying circuit 100 according to an embodiment of the present invention. As shown in FIG. 1, the amplifying circuit 100 comprises gain adjusting circuits 110 and 120, a loading circuit 130, a control signal generating circuit 140 and a switching circuit, wherein the switching circuit comprises switches SW1-SW4. In this embodiment, the amplifying circuit 100 comprises two transmission paths, i.e. the gain adjusting circuits 110 and 120 shown in FIG. 1. In addition, the amplifying circuit 100 is arranged to receive an input signal Vin for generating an output signal to one of the output terminals NF1 and NF2, and the following signal processing circuits process the output signal according to the voltage difference between the output terminal NF1 and NF2.

Figure 2:
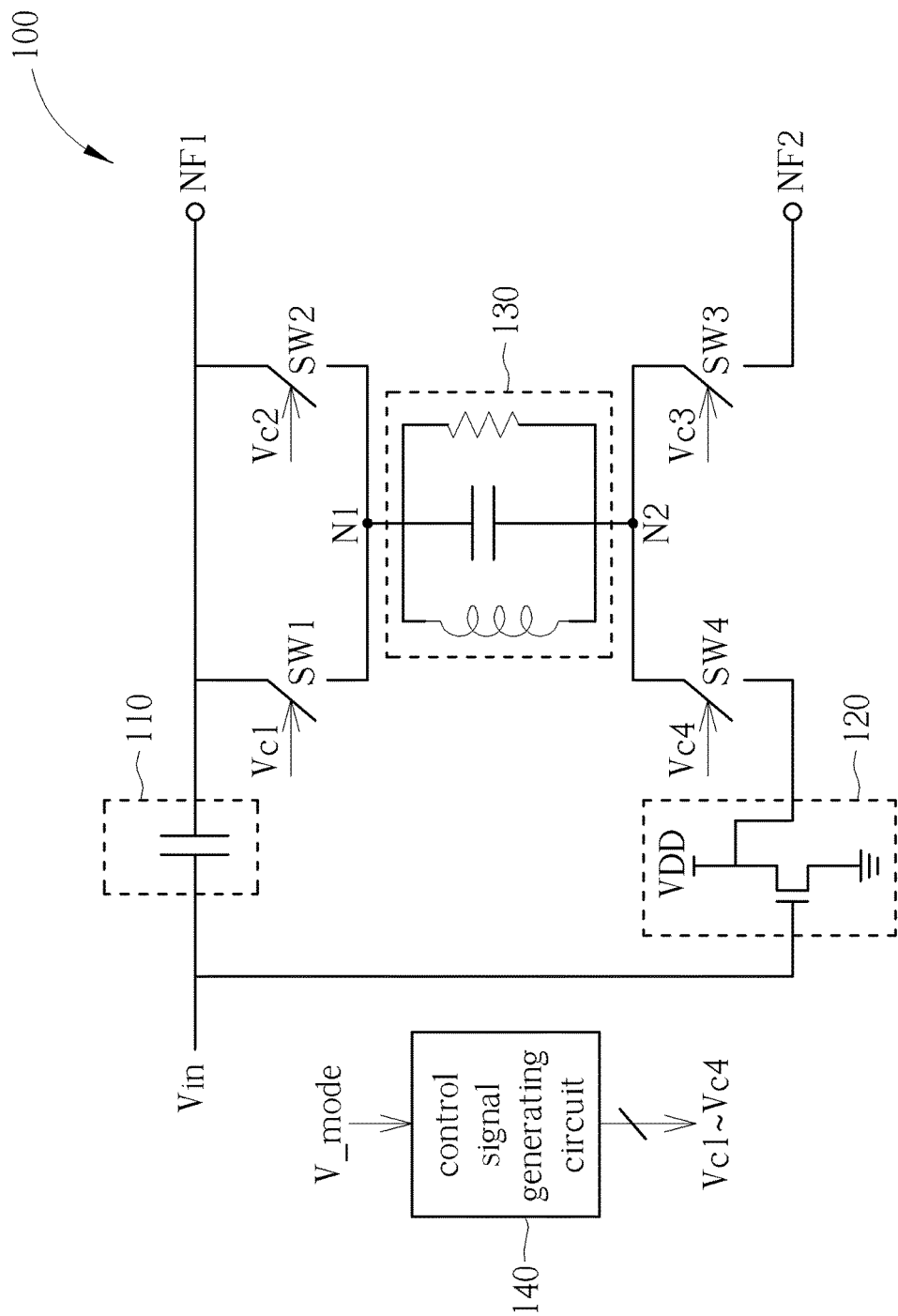
FIG. 2 is a diagram illustrating two gain adjusting circuits.

In this embodiment, the gain adjusting circuits 110 and 120 have different polarity/phase, and can be an amplifier implemented by transistors, or implemented by passive circuits. In the embodiment of FIG. 2, the gain adjusting circuit 110 is a capacitor, and the gain adjusting circuit 120 is s source follower, wherein the polarity/phase of the input and the output of the capacitor are identical, and the polarity/phase of the input and the output of the source follower are different. It should be noted that FIG. 2 is for illustrative purposes, and not a limitation of the present invention.

In the embodiment of FIG. 1, the loading circuit 130 comprises terminals N1 and N2, wherein the switch SW1 selectively connects the output signal generated by the gain adjusting circuit 110 to the terminal N1 of the loading circuit 130, the switch SW2 selectively connects the terminal N1 of the loading circuit 130 to the output terminal NF1 of the amplifying circuit 100, the switch SW3 selectively connects the terminal N2 of the loading circuit 130 to the output terminal NF2 of the amplifying circuit 100, and the switch SW4 selectively connects the output signal generated by the gain adjusting circuit 120 to the terminal N2 of the loading circuit 130. It should be noted that the composition of the loading circuit 130 shown in FIG. 1 is only for illustrative purposes. In other embodiments, the loading circuit 130 can be a resistor, a capacitor, or a resistor and capacitor connected in parallel.

In this embodiment, the output terminals NF1 and NF2 can selectively connect to any suitable low resistance point and receive a suitable direct current (DC) voltage, e.g. a supply voltage VDD.

For clarity, the following operation of the amplifying circuit 100 takes the embodiment of FIG. 2 as example. In the operation of the amplifying circuit 100, when the amplifying circuit 100 needs to operate in a first operating mode, the control signal generating circuit 140 generates control signals Vc1-Vc4 according to a received mode signal V_mode, wherein the control signals Vc1 and Vc3 are arranged to activate the switches SW1 and SW3, respectively, and the control signals Vc2 and Vc4 are arranged to deactivate the switches SW2 and SW4, respectively. At this point, the gain adjusting circuit 110 receives an input signal Vin, and transmits the output signal to the output terminal NF2 via the switch SW1, the loading circuit 130 and the switch SW3; meanwhile, the gain adjusting circuit 120 does not connect to the loading circuit 130 and the output terminals NF1 and NF2 due to the switches SW2 and SW4 being deactivated, and the output terminal NF1 does not receive any output signal from the gain adjusting circuits 110 and 120. Moreover, in this embodiment, the first operating mode is a mode with a low gain or a negative gain.

When the amplifying circuit 100 needs to operate in a second operating mode, the control signal generating circuit 140 generates the control signals Vc1-Vc4 according to the received mode signal V_mode, wherein the control signals Vc2 and Vc4 are arranged to activate the switches SW2 and SW4, respectively, and the control signals Vc1 and Vc3 are arranged to deactivate the switches SW1 and SW3, respectively. At this point, the gain adjusting circuit 120 receives the input signal Vin, and transmits the output single to the output terminal NF2 via the switch SW2, the loading circuit 130 and the switch SW4; meanwhile, the gain adjusting circuit 110 does not connect to the loading circuit 130 and the output terminals NF1 and NF2 due to the switches SW1 and SW3 being deactivated, and the output terminal NF1 does not receive any output signal from the gain adjusting circuits 110 and 120.

In the abovementioned embodiments, when the amplifying circuit 100 operates in the first operating mode, the polarity/phase of the output signal generated via the switch SW1, the loading circuit 130 and the switch SW3 and output to the output terminal NF2 is identical to the polarity/phase of the input signal because the gain adjusting circuit 110 is a capacitor; when the amplifying circuit 100 operates in the second operating mode, the polarity/phase of the output signal generated via the switch SW4, the loading circuit 130 and the switch SW2 and output to the output terminal NF1 is identical to the polarity/phase of the input signal because the gain adjusting circuit 120 is a source follower. If the following signal processing circuits process signals according to the voltage difference between the output terminals NF1 and NF2, the signal processing circuits can receive the signals with identical polarity no matter whether the amplifying circuit 110 operates in the first operating mode or the second operating mode. The failure of the processing signal can therefore be avoided.

Because the gain adjusting circuits 110 and 120 are connected to the terminals N1 and N2 of the loading circuit 130, respectively, the layout of the circuits can be more flexible which can lower the burden for the designer.

Figure 3:
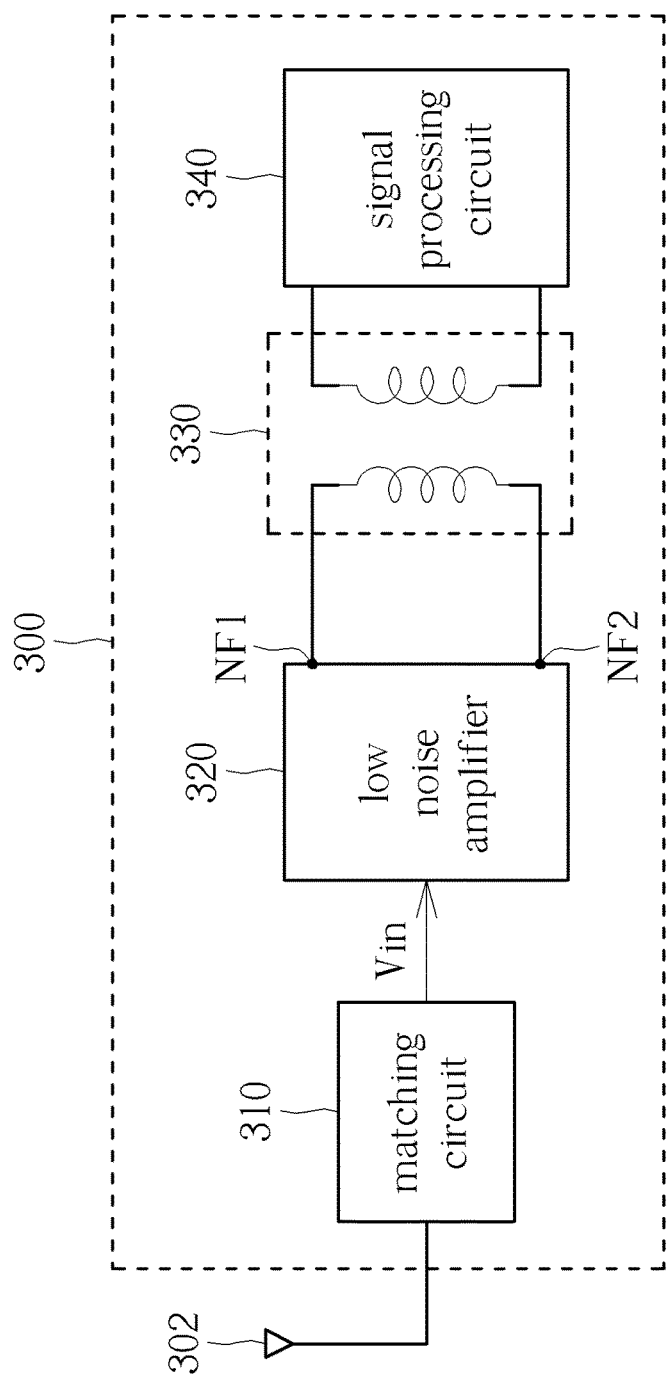
FIG. 3 is a diagram illustrating a receiver according to an embodiment of the present invention.

In this embodiment, the amplifying circuit 100 can be applied to a receiver. More specifically, refer to FIG. 3 which is a diagram illustrating a receiver 300 according to an embodiment of the present invention, wherein the receiver 300 comprises a matching circuit 310, a low noise amplifier 320, a transformer 330 and a signal processing circuit 340. In the operation of the receiver 300, the matching circuit 310 processes the signals from an antenna 302 to generate the input signal Vin; the low noise amplifier 320 can be implemented by the amplifying circuit 100 shown in FIG. 1 which is arranged to receive the input signal Vin and generate output signals to one of the output terminals NF1 and NF2; the transformers 330 comprise two non-electrically connected coils, wherein two terminals of a coil connect to the output terminals NF1 and NF2 of the low noise amplifier 320 respectively, and two terminals of the other coil generate voltage signals to the signal processing circuit 340; the signal processing circuit 340 processes the received signals. As mentioned above, the polarity/phase of the signals received by the signal processing circuit 340 will not be affected when the operating mode of the low noise amplifier 320 is switched. The failure of the processing signal can thereby be avoided.

Figure 4:
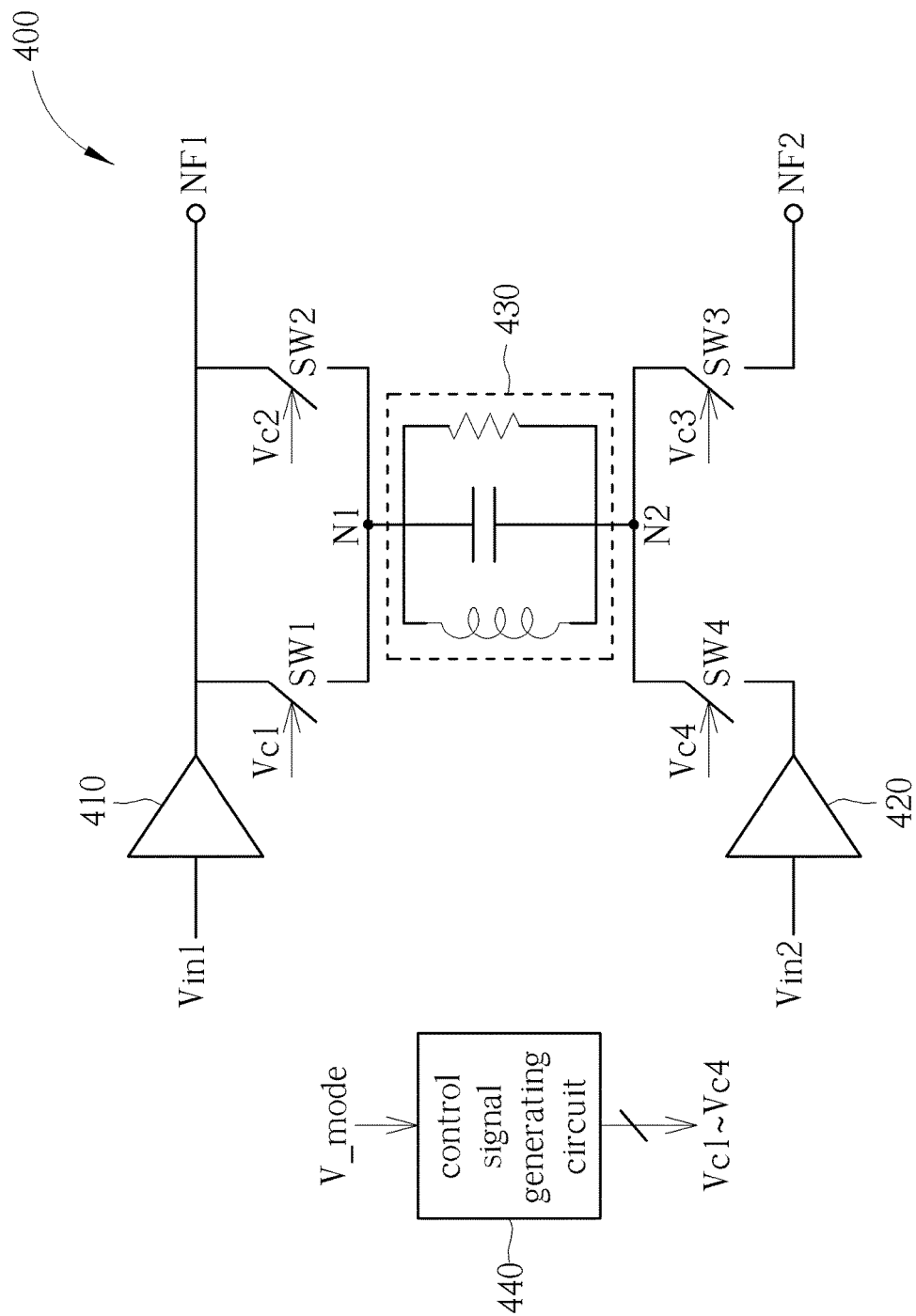
FIG. 4 is a diagram illustrating an amplifying circuit according to another embodiment of the present invention.

The gain adjusting circuits 110 and 120 of the amplifying circuit 100 shown in FIG. 1 receive the same input signal Vin. In other embodiments, however, the gain adjusting circuit 110 and 120 can receive the input signal from different sources. FIG. 4 is a diagram illustrating an amplifying circuit 400 according to another embodiment of the present invention. As shown in FIG. 4, the amplifying circuit 400 comprises gain adjusting circuits 410 and 420, a loading circuit 430, a control signal generating circuit 440 and a switching circuit, wherein the switching circuit comprises switches SW1-SW4. In this embodiment, the amplifying circuit 400 has two transmission paths, i.e. the gain adjusting circuits 410 and 420 shown in FIG. 4.

The operation of the amplifying circuit 400 is similar to the operation of the amplifying circuit 100; the only difference is, when the amplifying circuit 400 operates in the first operating mode, the gain adjusting circuit 410 receives the input signal Vin, and transmits the output signal to the output terminal NF2 via the switch SW1, the loading circuit 430 and the switch SW3, and the output terminal NF1 does not receives the output signals from the gain adjusting circuits 410 and 420. When the amplifying circuit 400 operates in the second operating mode, the gain adjusting circuit 420 receives an input signal Vin2, and transmits the output signal to the output terminal NF1 via the switch SW4, the loading circuit 430 and the switch SW2, and the output terminal NF2 does not receive the output signal from the gain adjusting circuit 410 and 420. Those skilled in the art should readily understand the operation of the amplifying circuit 400 after reading the embodiment of FIG. 1; the detailed description is therefore omitted here.

Briefly summarized, in the amplifying circuit with two gain adjusting circuits (i.e. two transmission paths) proposed by the present invention, in the case that the polarity of the output signals of the gain adjusting circuits are different, the output signals of the gain adjusting circuits can be transmitted to different output terminals with the help of the switching circuit to make sure the polarity of the output signal of the amplifying circuit will not change in response to the switch of the gain adjusting circuit, thereby avoiding failure of the processing signal. In addition, the gain adjusting circuits are connected to different terminals of the loading circuit, meaning the layout of the circuits can be more flexible.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An amplifying circuit, comprising:
   a first output terminal and a second output terminal;
   a first gain adjusting circuit;
   a second gain adjusting circuit;
   a loading circuit; and
   a switching circuit, coupled to the first gain adjusting circuit, the second gain adjusting circuit, the loading circuit, the first output terminal and the second output terminal of the amplifying circuit;
   wherein when the amplifying circuit operates in a first operating mode, the first gain adjusting circuit receives a first input signal, and transmits a first output signal to the second output terminal of the amplifying circuit via the switching circuit and the loading circuit, and the first output signal is not transmitted to the first output terminal at this point; and when the amplifying circuit operates in a second operating mode, the second gain adjusting circuit receives a second input signal, and transmits a second output signal to the first output terminal via the switching circuit and the loading circuit, and the second output signal is not transmitted to the second output terminal at this point.

2. The amplifying circuit of claim 1, wherein a phase of the first output signal generated by the first gain adjusting circuit is the same as a phase of the first input signal, and a phase of the second output signal generated by the second gain adjusting circuit is the same as a phase of the second input signal.

3. The amplifying circuit of claim 2, wherein the first gain adjusting circuit is a capacitor, and the second gain adjusting circuit is a source follower.

4. The amplifying circuit of claim 1, wherein when the amplifying circuit operates in the first operating mode, the second output signal generated by the second gain adjusting circuit is not received by the first output terminal and the second output terminal of the amplifying circuit; and when the amplifying circuit operates in the second operating mode, the first output signal generated by the first gain adjusting circuit is not received by the first output terminal and the second output terminal of the amplifying circuit.

5. The amplifying circuit of claim 1, wherein the loading circuit comprises a first terminal and a second terminal, and the switching circuit comprises:
   a first switch, arranged to selectively connect the first output signal generated by the first gain adjusting circuit to the first terminal of the loading circuit;
   a second switch, arranged to selectively connect the first terminal of the loading circuit to the first output terminal of the amplifying circuit;
   a third switch, arranged to selectively connect the second terminal of the loading circuit to the second output terminal of the amplifying circuit; and
   a fourth switch, arranged to selectively connect the second output signal generated by the second gain adjusting circuit to the second terminal of the loading circuit.

6. The amplifying circuit of claim 5, wherein when the amplifying circuit operates in the first operating mode, the first switch and the third switch are activated while the second switch and the fourth switch are deactivated; and when the amplifying circuit operates in the second operating mode, the first switch and the third switch are deactivated while the second switch and the fourth switch are activated.

7. The amplifying circuit of claim 1, wherein one of two terminals of a side coil of a transformer connects to the first output terminal of the amplifying circuit, and the other of the two terminals connects to the second output terminal of the amplifying circuit.

8. The amplifying circuit of claim 1, wherein the amplifying circuit is a low noise amplifier installed within a receiver.

9. A receiver, comprising:
   a matching circuit;
   a low noise amplifier, coupled to the matching circuit, comprising:
      a first output terminal and a second output terminal;
      a first gain adjusting circuit;
      a second gain adjusting circuit;
      a loading circuit; and
      a switching circuit, coupled to the first gain adjusting circuit, the second gain adjusting circuit, the loading circuit, the first output terminal and the second output terminal of the low noise amplifier;
      wherein when the low noise amplifier operates in a first operating mode, the first gain adjusting circuit receives a first input signal from an antenna via the matching circuit, and transmits a first output signal to the second output terminal of the low noise amplifier via the switching circuit and the loading circuit, and the first output signal is not transmitted to the first output terminal; and when the low noise amplifier operates in a second operating mode, the second gain adjusting circuit receives a second input signal from the antenna via the matching circuit, and transmits a second output signal to the first output terminal of the low noise amplifier via the switching circuit and the loading circuit, and the second output signal is not transmitted to the second output terminal; and
   a transformer wherein one of two terminals of a side coil of the transformer connects to the first output terminal of the low noise amplifier, and the other of the two terminals connects to the second output terminal of the low noise amplifier.

10. The receiver of claim 9, wherein a phase of the first output signal generated by the first gain adjusting circuit is the same as a phase of the first input signal, and a phase of the second output signal generated by the second gain adjusting circuit is the same as a phase of the second input signal.

* * * * *